United States Patent
Bushmaker

(10) Patent No.: US 9,467,103 B2
(45) Date of Patent: Oct. 11, 2016

(54) SYSTEM LINEARIZATION ASSEMBLY AND METHOD FOR USE IN MODIFYING DISTORTION COMPONENTS

(71) Applicant: The Aerospace Corporation, ElSegundo, CA (US)

(72) Inventor: Adam Wayne Bushmaker, Los Angeles, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 14/140,309

(22) Filed: Dec. 24, 2013

(65) Prior Publication Data
US 2015/0145603 A1 May 28, 2015

Related U.S. Application Data

(63) Continuation-in-part of application No. 14/089,551, filed on Nov. 25, 2013.

(51) Int. Cl.
| | |
|---|---|
| *H03F 1/26* | (2006.01) |
| *H03F 1/32* | (2006.01) |
| *H03F 3/193* | (2006.01) |
| *H03F 1/02* | (2006.01) |

(52) U.S. Cl.
CPC ............ *H03F 3/193* (2013.01); *H03F 1/0272* (2013.01); *H03F 1/3205* (2013.01); *H03F 2200/294* (2013.01); *H03F 2200/504* (2013.01); *H03F 2200/516* (2013.01); *H03F 2201/3203* (2013.01); *H03F 2201/3215* (2013.01)

(58) Field of Classification Search
USPC ................. 330/149, 129, 136; 375/296–297; 455/114.3
See application file for complete search history.

(56) References Cited

U.S. PATENT DOCUMENTS

| 6,177,836 B1 | 1/2001 | Young et al. |
| 6,320,461 B1 | 11/2001 | Lee |
| 8,018,278 B2 * | 9/2011 | Jung et al. ..................... 330/149 |

FOREIGN PATENT DOCUMENTS

WO    WO 2011/061637 A1    5/2011

OTHER PUBLICATIONS

Dawson, Joel L; "Workshop on RF Circuits for 2.5G and 3G Wireless Systems"; *Power Amplifier Linearization Techniques: An Overview*; Feb. 4, 2001; 27 pages.

(Continued)

*Primary Examiner* — Hieu Nguyen
(74) *Attorney, Agent, or Firm* — Manita Rawat Duane Morris LLP

(57) ABSTRACT

A system linearization assembly generally includes a delay device that receives an input signal from a signal source and delays the input signal by a predetermined delay function. An attenuation device receives a modified output signal from a signal modifying device, wherein the output signal is based on the input signal and includes a time varying parameter representing a plurality of frequency components including at least one component caused by non-linear intermodulation distortion. The attenuation device attenuates the output signal by a factor that is equal to at least one parameter of the modifying device. A computing device compares the attenuated output signal with the delayed input signal to obtain a resultant signal that includes the component caused by non-linear intermodulation distortion. A detection device detects at least one parameter of the resultant signal. Based on the detected parameter, a controller facilitates a modification of the component.

20 Claims, 3 Drawing Sheets

(56) References Cited

OTHER PUBLICATIONS

De Carvalho, N.B. and Pedro, J.C.; "Large Signal IMD Sweet Spots in Microwave Power Amplifiers" *Microwave Symposium Digest, 1999 IEEE MTI-S Digest.* (1999); pp. 517-520.

De Carvalho, Nuno Borges, et al; "Large- and Small-Signal IMD Behavior of Microwave Power Amplifiers"; *IEEE Transactions on Microwave Theory and Techniques*, vol. 47, No. 12; Dec. 1999; pp. 2364-2374.

Fager, Christian, et al; "Prediction of IMD in LDMOS Transistor Amplifiers Using a New Large-Signal Model": *IEEE Transactions on Microwave Theory and Techniques*, vol. 50, No. 12, Dec. 2002; pp. 2834-2842.

Joshin, Kazukiyo, et al; "Harmonic Feedback Circuit Effects on Intermodulation Products and Adjacent Channel Leakage Power in HBT Power Amplifier for 1.95 GHz Wide-Band CDMA Cellular Phones"; *IEICE Trans. Electron.*, vol. E82-C, No. 5; May 1999; pp. 725-772.

Kang, Jongchan, et al.; "A Highly Linear and Efficient Differential CMOS Power Amplifier CMOS Power Amplifier With Harmonic Control", *IEEE Journal of Solid-State Circuits*, vol. 41, N.. 6; Jun. 2006; pp. 1314-1322.

Lee, Chien-Ping, et al.: "Averaging and Cancellation Effect of High-Order Nonlinearity of a Power Amplifier"; IEEE Transactions on Circuits and Systems—I: Regular Papers, vol. 54, No. 12; Dec. 2007; pp. 2733-2740.

Miers, T. H. and Hirsch, V. A.; "A Thorough Investigation of Dynamic Bias on Linear GAM FET Power Amplifier Performance", *IEEE MTT-S Digest*; (1992); pp. 537-540.

* cited by examiner

SYSTEM LINEARIZATION ASSEMBLY AND METHOD FOR USE IN MODIFYING DISTORTION COMPONENTS

RELATED AND CO-PENDING APPLICATION

This application is a continuation-in-part of and claims priority to co-pending U.S. patent application Ser. No. 14/089,551 entitled SYSTEM LINEARIZATION ASSEMBLY AND METHOD FOR USE IN MODIFYING DISTORTION COMPONENTS filed Nov. 25, 2013, which is incorporated herein by reference in its entirety.

STATEMENT OF GOVERNMENT INTEREST

This invention was made with government support under Contract No. FA8802-09-C-0001 awarded by the Department of the Air Force. The government has certain rights in this invention.

BACKGROUND

The embodiments described herein relate generally to systems that effect a transfer function on an input signal to produce an output signal that ideally has a predetermined relationship to the input signal, such as amplifier systems, and, more particularly, to a system linearization assembly that may be used with such signal handling systems.

Signal processing systems, such as amplifier systems, are configured to modify or change at least one parameter of a signal. For example, an amplifier system may be configured to receive an input signal and to increase the amplitude of the signal, preferably without inducing other changes to the signal in the process. The amplified signal or the output signal can then be transmitted to a transmission line or to an antenna, for example.

However, at least some amplifier circuits and similar systems exhibit at least some form of non-linear behavior, which may result in a distortion of the amplified or output signal. Such a distortion may decrease the overall performance of the amplifier system. For example, a harmonic distortion in an electronic amplifier introduces abnormalities in the output signal at the fundamental input frequency (w) and at multiples of the input frequency (2w, 3w, etc.) that constitute the inherent distortion. Some harmonic distortion can be filtered out by using bandpass filters. Intermodulation distortions (IMD), however, include the difference of the frequencies in the output, and can be difficult to filter out of the amplified or output signal. More specifically, in the case of two closely spaced input signals ($w_1$ and $w_2$), the resulting intermodulation (IMD) component frequency for a $3^{rd}$ order intermodulation (IM3) and other odd terms is immediately adjacent to the signals. When the resulting IMD component frequency is immediately adjacent to the signals in the frequency spectrum, it can be difficult to filter out. The intensity of an $n^{th}$ order intermodulation distortion component is proportional to the intensity of the $n^{th}$ order harmonic distortion component, provided the impedance of the output circuit is the same at both frequencies.

At least some methods have been proposed for linearization of amplified or output signals. For example, one method is known as the "power backoff" method. The idea is to reduce the input signal amplitude so as to avoid driving the amplifier output into distortion. Such techniques control distortion and noise at the expense of amplification efficiency. Other known methods include pre-distortion and post-distortion methods to cancel the effect of the amplifier's non-linearity.

These conventional methods seek to minimize the adverse effects of the non-linearity but fail to correct the nonlinearity of the amplifier itself. Instead, such methods merely "cover" or "patch" the non-linearity such that the adverse effects of the non-linearity can be less apparent.

The nonlinearities in transistor amplifiers are strongly dependent on the quiescent voltage and current bias settings at which the amplifier operates. For instance, by changing the bias voltages supplied to a transistor amplifier, the $3^{rd}$ order nonlinear distortion can be reduced or increased. This allows for nonlinear distortion to be minimized without significantly compromising the gain in the system.

BRIEF DESCRIPTION

In one embodiment, a system linearization assembly is provided. The system linearization assembly generally includes a delay device that is configured to receive an input signal from a signal source and to delay the input signal by a predetermined delay function. An attenuation device is coupled to the delay device. The attenuation device is configured to receive a modified output signal from a signal modifying device, wherein the modified output signal is based on the input signal and includes a time varying parameter representing a plurality of frequency components including at least one component caused by non-linear intermodulation distortion. The attenuation device is also configured to attenuate the modified output signal by a factor that is equal to at least one parameter of the signal modifying device. The delay device is configured to delay the signal by a delay function equal to the delay experienced by the signal as it passes through the signal modifying device such that the phase of the delayed signal and the attenuated signal are equal. A computing device is coupled to the delay device and to the attenuation device. The computing device is configured to compare the attenuated modified output signal with the delayed input signal and to obtain, from the comparison, a resultant signal that includes the component caused by non-linear intermodulation distortion. A detection device is coupled to the computing device, wherein the detection device is configured to detect at least one parameter of the resultant signal. The system linearization assembly also includes a controller that is coupled to the detection device, wherein the controller is configured to facilitate a modification of the component caused by non-linear intermodulation distortion based on the detected parameter.

In another embodiment, a signal processing system is provided. The signal processing system generally includes a signal modifying device and a system linearization assembly coupled to the signal modifying device. The signal modifying device is configured to receive an input signal from a signal source and to modify the input signal to generate a modified output signal, wherein the modified output signal includes a time varying parameter representing a plurality of frequency components including at least one component caused by non-linear intermodulation distortion. The system linearization assembly includes a delay device that is configured to receive the input signal and to delay the input signal by a predetermined delay function. An attenuation device is coupled to the delay device, wherein the attenuation device is configured to receive the modified output signal from the signal modifying device and to attenuate the modified output signal by a factor that is equal to at least one parameter of the signal modifying device. The delay device is configured to delay the signal by a delay function equal to the delay experienced by the signal as it passes through the signal modifying device such that the phase of the delayed signal and the attenuated signal are equal. A computing device is coupled to the delay device and to the attenuation device. The computing device is configured to compare the attenuated modified output signal with the delayed input signal and to obtain, from the comparison, a resultant signal that includes the component caused by non-linear intermodulation distortion. A detection device is coupled to the computing device, wherein the detection device is configured to detect at least one parameter of the resultant signal. A controller is coupled to the detection device, wherein the controller is configured to facilitate a modification of the component caused by non-linear intermodulation distortion based on the detected parameter.

In yet another embodiment, a method for modifying distortion components is provided. An input signal is received via a delay device. The input signal is delayed by a predetermined delay function via the delay device. A modified output signal is transmitted from a signal modifying device to an attenuation device that is coupled to the delay device. The modified output signal is based on the input signal and includes a time varying parameter representing a plurality of frequency components including at least one component caused by non-linear intermodulation distortion. The modified output signal is attenuated by a factor that is equal to at least one parameter of the signal modifying device, via the attenuation device. The delay device is configured to delay the signal by a delay function equal to the delay experienced by the signal as it passes through the signal modifying device such that the phase of the delayed signal and the attenuated signal are equal. The attenuated modified output signal is compared with the delayed input signal to derive, from the comparison, a resultant signal that includes the component caused by non-linear intermodulation distortion, via a computing device that is coupled to the delay device and to the attenuation device. At least one parameter of the resultant signal is detected via a detection device that is coupled to the computing device. A modification of the component caused by non-linear intermodulation distortion is facilitated via a controller that is coupled to the detection device, wherein the modification is based on the detected parameter.

DETAILED DESCRIPTION

The embodiments described herein include a system linearization assembly that can be used with signal processing systems, such as an amplifier system, for substantially reducing or minimizing non-linear intermodulation distortion components within the signals produced by the system. The system linearization assembly is configured to receive an input signal from a signal source and to delay the input signal by a predetermined delay function. The system linearization assembly is also configured to receive a modified output signal from a signal modifying device, wherein the modified output signal is based on the input signal and includes a time varying parameter representing a plurality of frequency components including at least one component caused by non-linear intermodulation distortion. The modified output signal can be attenuated by a factor that is equal to at least one parameter of the signal modifying device and the attenuated modified output signal can be compared with the delayed input signal to obtain a resultant signal that includes the component caused by non-linear intermodulation distortion. The delay device is configured to delay the signal by a delay function equal to the delay experienced by the signal as it passes through the signal modifying device such that the phase of the delayed signal and the attenuated signal are equal. At least one parameter of the resultant signal can be detected and the detected parameter can be used to facilitate a modification of the component caused by non-linear intermodulation distortion. Such a modification enables a reduction or minimization of the component caused by non-linear intermodulation distortion from the signal processing system by modifying the signal processing system itself rather than merely "covering" or "patching" the non-linear intermodulation distortion component to hide its effects.

Figure 1:
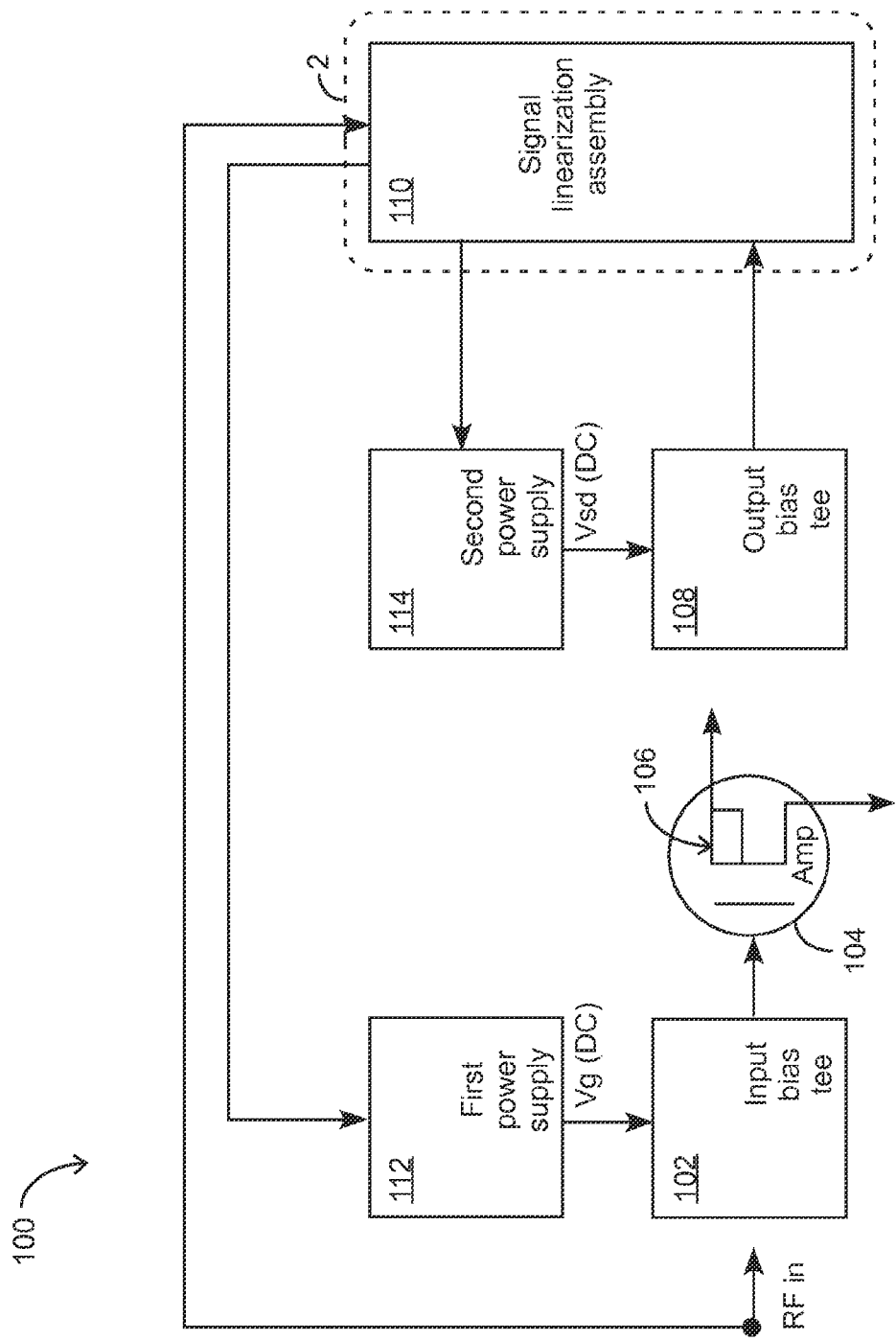
FIG. 1. is block diagram of an exemplary signal processing system.

FIG. 1 illustrates an exemplary signal processing system 100. In the exemplary embodiment, signal processing system 100 is an amplifier system that is configured to modify a signal by a transfer function, normally by increasing the power of the signal by a gain factor that is linearly applied across all frequencies in a pass band. The invention is also applicable to signal processing systems with transfer functions that are not algebraically linear but are nevertheless predetermined functions, in which case the term "linear" should be construed broadly as meaning conforming to the predetermined transfer function. The terms "non-linear" and "distortion" refer to output signals or processed intermediate signals that depart from the predetermined transfer function at particular frequencies and potentially at the harmonics of those frequencies as well. Although the exemplary embodiment illustrates an amplifier system, the present disclosure is not limited to amplifier systems and one of ordinary skill in the art will appreciate that the current disclosure may be used in connection with other types of signal processing system that apply a transfer function to an input signal having components with amplitude and frequency characteristics, to obtain an output signal that ideally conforms to the product of the input signal and the transfer function but is subject to some form of distortion or error.

System 100 includes an input device or an input bias tee 102 that is configured to receive a signal from a signal source, such as an antenna (not shown). In some embodiments, the signal can be a radio frequency (RF) signal that is being received via the antenna at a frequency ranging from about 10 Kilohertz to about 300,000 Megahertz. In the exemplary embodiment, input bias tee 102 is configured to combine the RF signal with an electrical bias signal, such as a direct current (DC) voltage. Input bias tee 102 can also be configured to combine alternating current (AC) signals with DC signals and/or to separate the AC components from the DC components and/or to combine and/or to separate higher and lower frequency components.

A signal modification device, such as an amplifier 104, is coupled to input bias tee 102. Amplifier 104 is configured to alter the input signal according to a transfer function, such as to apply a gain factor to multiply the voltage or current or numerically digitized amplitude of a signal received from input bias tee 102 to generate a modified output signal, such as an amplified signal. It should be noted that, as used herein, the term "couple" is not limited to a direct mechanical and/or an electrical connection between components, but may also include an indirect mechanical and/or electrical connection between two or more components or a coupling that is operative through intermediate elements or spaces. Amplifier 104 includes a transistor 106, such as a field-effect transistor (FET) or a bipolar-junction transistor (BJT), wherein transistor 106 is configured to be biased at an optimum voltage for amplification of the signal received from input bias tee 102. The modified output signal or the amplified signal may include a time varying parameter, such as a plurality of waves, representing a plurality of frequency components including at least one component caused by non-linear intermodulation distortion, such as odd-order intermodulation distortion, that can be introduced into the signal during the amplification.

In the exemplary embodiment, an output device or an output bias tee 108 is coupled to amplifier 104. Output bias tee 108 is configured to transmit the modified output signal or the amplified signal from amplifier 104 to a system linearization assembly 110 that is coupled to output bias tee 108. As explained in more detail below with respect to FIGS. 2 and 3, system linearization assembly 110 is configured to facilitate modifying or minimizing the non-linear intermodulation distortion component, such as an odd-order intermodulation distortion, based on a comparison between the input signal and the amplified signal.

System 100, also includes a plurality of power supplies. For example, system 100 includes a first power supply 112 that is coupled to system linearization assembly 110 and to input bias tee 102, and system 100 also includes a second power supply 114 that is coupled to system linearization assembly 110 and to output bias tee 108. In the exemplary embodiment, first power supply 112 is configured to supply DC voltages to input bias tee 102 and second power supply 114 is configured to supply DC voltages to output bias tee 108. As explained in more detail below with respect to FIGS. 2 and 3, system linearization assembly 110 is configured to control first power supply 112 and second power supply 114 such that the voltages being supplied to input bias tee 102 and output bias tee 108, respectively, can be adjusted as a means to amplify or attenuate or merely to follow the signal level as passing through the input and output bias tees 102, 108. This bias control can be configured as a voltage based control as mentioned or in other embodiments that control can be based on current bias, variable resistance, numeric scaling, etc.

During operation of system 100, at least one signal, such as an RF signal (i.e., input signal), is generated by a signal source, e.g., received on an antenna (not shown). At least a portion of the input signal is transmitted from the antenna to input bias tee 102 and a portion of the input signal is transmitted to signal linearization assembly 110. Power supply 112 transmits a control voltage, such as a DC voltage, to input bias tee 102. As such, input bias tee 102 is enabled to combine the recently received input signal with the voltage. When the input signal is combined with the voltage, a quiescent operating gate voltage ($V_g$) is set for the amplifier. Amplifier 104 then modifies the input signal by amplifying the power of the signal and the amplified signal is transmitted to output bias tee 108 such that the amplified signal can also be transmitted to system linearization assembly 110.

The amplified signal includes a time varying parameter representing a plurality of frequency components including at least one component caused by non-linear intermodulation distortion, such as odd-order intermodulation distortion. Amplifier 104 exhibits some level of non-linear behavior which distorts the output signal. Odd-ordered intermodulation nonlinearity (IM3, IM5, etc.) is of particular concern because noise and other interference can become mixed with the signal within the amplifier passband. However, there are naturally occurring nulls in the output powers of the $n^{th}$ odd-ordered intermodulation (IM3, IM5, etc.) that occur when the weighted mean of the $n^{th}$ derivative of the amplifier voltage transfer curve is zero. Moreover, the output powers and position of naturally occurring nulls of these intermodulation components are dependent on a drain-source voltage quiescent voltage bias ($V_{sd}$) and a gate source voltage quiescent voltage bias ($V_g$). As such, the $3^{rd}$ order intermodulation (IM3) can be substantially reduced when the $3^{rd}$ derivative of the amplifier voltage transfer curve is zero. Therefore, as explained in more detail below, with respect to FIGS. 2 and 3, system linearization assembly 110 measures or detects the non-linear intermodulation component(s) in the amplified signal by comparing the amplified signal with the input signal. System linearization assembly 110 then adjusts amplifier bias voltages to minimize or substantially reduce the odd-order intermodulation distortion intensity (i.e., the non-linear intermodulation distortion component) based on the determined measurement.

Figure 2:
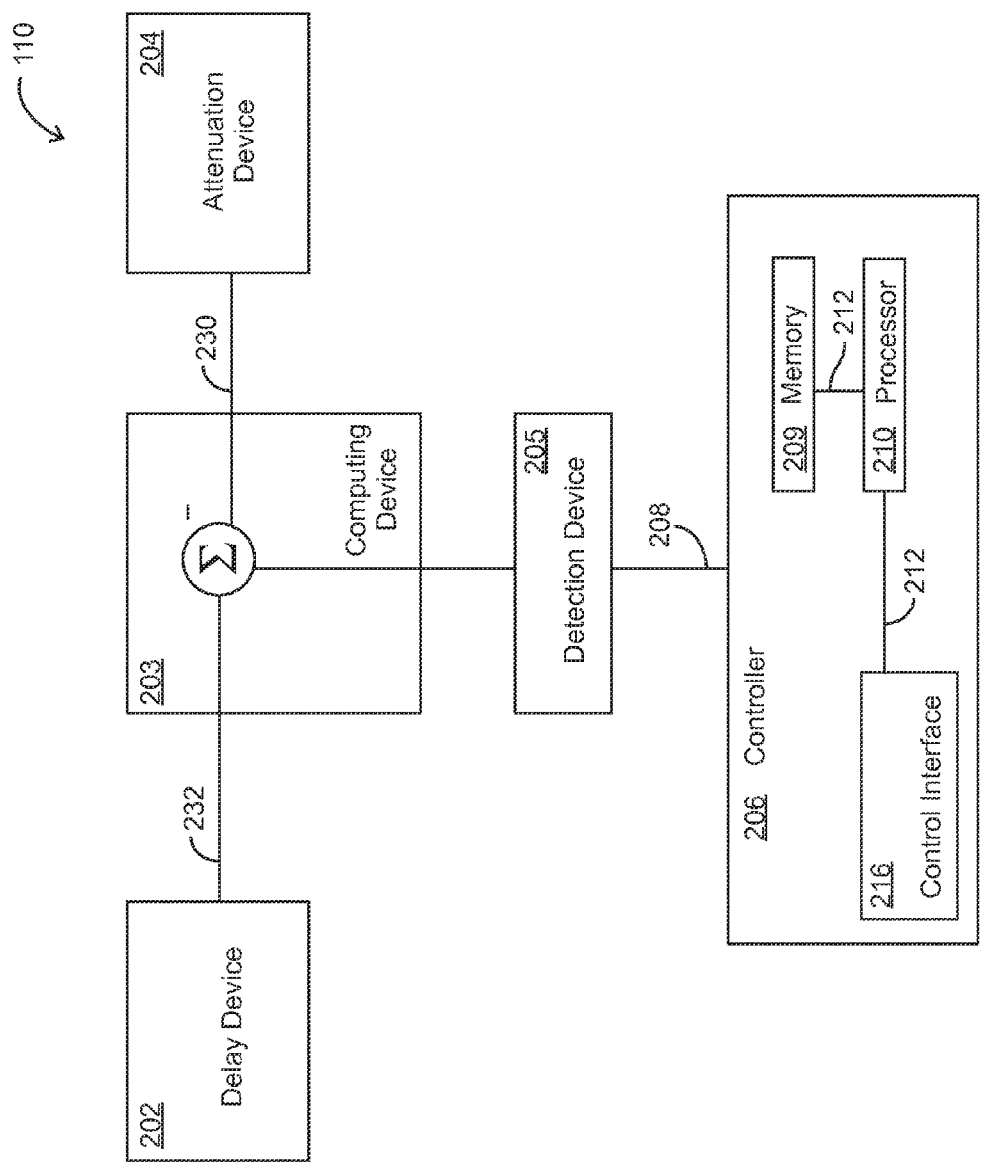
FIG. 2 is a block diagram of an exemplary system linearization assembly that may be used with the signal processing system shown in FIG. 1 and taken from area 2.

FIG. 2 illustrates system linearization assembly 110 taken from area 2 (shown in FIG. 1). In the exemplary embodiment, system linearization assembly 110 includes a delay device 202 coupled to a signal source such as an antenna (not shown). Delay device 202 can be any type of delay device that is configured to delay a signal by a predetermined delay function. For example, delay device 202 can delay a signal by a time delay measurement, such as in microseconds or milliseconds, that is equal to the time delay or an average of the time delay of the signals that pass through amplifier 104 (shown in FIG. 1). Delay device 202 is configured to delay the signal by a delay function equal to the delay experienced by the signal as it passes through the signal modifying device such that the phase of the delayed signal and the attenuated signal are equal.

In the exemplary embodiment, an attenuation device or attenuator 204 is coupled to delay device 202 and to output bias tee 108 (shown in FIG. 1). Attenuation device 204 can be configured to receive an amplified signal from amplifier 104 via output bias tee 108. Attenuation device 204 can also be configured to attenuate the amplified signal by a factor that is equal to at least one parameter of the amplifier 104. For example, attenuating device 204 can attenuate the amplified signal by a factor that is equal to the gain of the amplifier 104. For example, if the gain of the amplifier 104 is 23 dB, then the attenuation of attenuating device 204 should be 23 dB.

Attenuation device 204 and delay device 202 are each coupled to a computing device 203, via signal paths 230 and 232, respectively. In some embodiments, computing device 203 can be a differential amplifier that performs the subtraction with a positive and negative input (non-inverting and inverting inputs), and what is amplified is the difference. That is, the differential amplifier can be configured to take the difference between the inverting and non-inverting inputs and this difference can be amplified and/or passed on to the output. Computing device 203 can also be a summing junction, difference junction or a subtractor. In the exemplary embodiment, computing device 203 is configured to receive the amplified signal that has been attenuated from attenuation device 204. Computing device 203 is also configured to receive the input signal that has been delayed from delay device 202. Computing device 203 is further configured to compare the attenuated amplified signal with the delayed input signal to obtain a resultant signal that is representative of the non-linear intermodulation component(s) that had been injected into the amplified signal by amplifier 104.

A detection or measuring device 205 is coupled to computing device 203. Detection device 205 can be a radiometer or other type of radio wave detection device that detects or measures are least one parameter of the resultant signal, such as the phase or amplitude of the non-linear intermodulation component(s).

System linearization assembly 110 also includes a controller 206 that is coupled to detection device 205 via conduit 208. Controller 206 is further operatively coupled to vary the operation of first power supply 112 (shown in FIG. 1) and second power supply 114 (shown in FIG. 1) as a function of values determined from detection device 205, such as the determined phase or amplitude. More specifically, controller 206 may be coupled to, for example, at least one controllable voltage or current regulator (not shown) in first power supply 112 and at least one controllable voltage or current regulator (not shown) in second power supply 114. Controller 206 is enabled to facilitate operative features of the controllable voltage or current regulators, via features that include, without limitation, receiving permissive inputs, transmitting permissive outputs, and transmitting opening and closing commands.

In the exemplary embodiment, controller 206 may be a real-time controller and may include any suitable processor-based or microprocessor-based system, such as a computer system, that includes microcontrollers, reduced instruction set circuits (RISC), application-specific integrated circuits (ASICs), logic circuits, and/or any other circuit or processor that is capable of executing the functions described herein. In one embodiment, controller 206 may be a microprocessor that includes read-only memory (ROM) and/or random access memory (RAM), such as, for example, a 32 bit microcomputer with 2 Mbit ROM and 64 Kbit RAM. As used herein, the term "real-time" refers to outcomes occurring in a substantially short period of time after a change in the inputs affect the outcome, with the time period being a design parameter that may be selected based on the importance of the outcome and/or the capability of the system processing the inputs to generate the outcome.

Controller 206, in the exemplary embodiment, includes a memory device 209 that stores executable instructions and/or one or more operating parameters representing and/or indicating an operating condition of first power supply 112 and second power supply 114. Controller 206 also includes a processor 210 that is coupled to memory device 209 via a system bus 212. In one embodiment, processor 210 may include a processing unit, such as, without limitation, an integrated circuit (IC), an application specific integrated circuit (ASIC), a microcomputer, a programmable logic controller (PLC), and/or any other programmable circuit. Alternatively, processor 210 may include multiple processing units (e.g., in a multi-core configuration). The above examples are exemplary only, and thus are not intended to limit in any way the definition and/or meaning of the term "processor."

Moreover, in the exemplary embodiment, controller 206 includes a control interface 216 that is coupled to first power supply 112 and to second power supply 114. More specifically, control interface 216 is coupled to the controllable voltage or current regulators (not shown) within first power supply 112 and within second power supply 114, and control interface 216 is configured to control an operation of the controllable voltage or current regulators. For example, processor 210 may be programmed to generate one or more control parameters that are transmitted to control interface 216. Control interface 216 may then transmit a control parameter to modulate, open, or close the controllable voltage or current regulators.

Various connections are available between control interface 216 and first power supply 112 and second power supply 114. Such connections may include, without limitation, an electrical conductor, a low-level serial data connection, such as Recommended Standard (RS) 232 or RS-485, a high-level serial data connection, such as USB, a field bus, a PROFIBUS®, or Institute of Electrical and Electronics Engineers (IEEE) 1394 (a/k/a FIREWIRE), a parallel data connection, such as IEEE 1284 or IEEE 488, a short-range wireless communication channel such as BLUETOOTH, and/or a private (e.g., inaccessible outside system 100) network connection, whether wired or wireless. PROFIBUS is a registered trademark of Profibus Trade Organization of Scottsdale, Ariz. IEEE is a registered trademark of the Institute of Electrical and Electronics Engineers, Inc., of New York, N.Y. BLUETOOTH is a registered trademark of Bluetooth SIG, Inc. of Kirkland, Wash.

During operation, at least one signal, such as an RF signal (i.e., input signal), is generated by a signal source, such as an antenna (not shown). At least a portion of the input signal is transmitted from the antenna to input bias tee 102 such that the signal can be amplified and a portion of the input signal is transmitted to delay device 202. The amplified signal is transmitted to attenuation device 204. As explained in more detail below with respect to FIG. 3, delay device 202 delays the input signal received by a predetermined delay function equal to the delay experienced by the signal as it passes through the signal modifying device such that the phase of the delayed signal and the attenuated signal are equal, and attenuation device 204 attenuates the amplified signal by a factor that is equal to at least one parameter of amplifier 104. The attenuated amplified signal and the delayed input signal are transmitted to computing device 203, wherein the attenuated amplified signal is compared with the delayed input signal to obtain a resultant signal that is representative of the non-linear intermodulation component(s) that had been injected into the amplified signal by amplifier 104. The resultant signal is transmitted to detection device 205, which detects at least one parameter of the signal. Based on the detected parameter, controller 206 adjusts the voltages being supplied to input bias tee 102 and to output bias tee 108 by controlling the first power supply 112 and second power supply 114, respectively. When the voltages are adjusted, the non-linear intermodulation distortion component can be minimized or substantially reduced.

Figure 3:
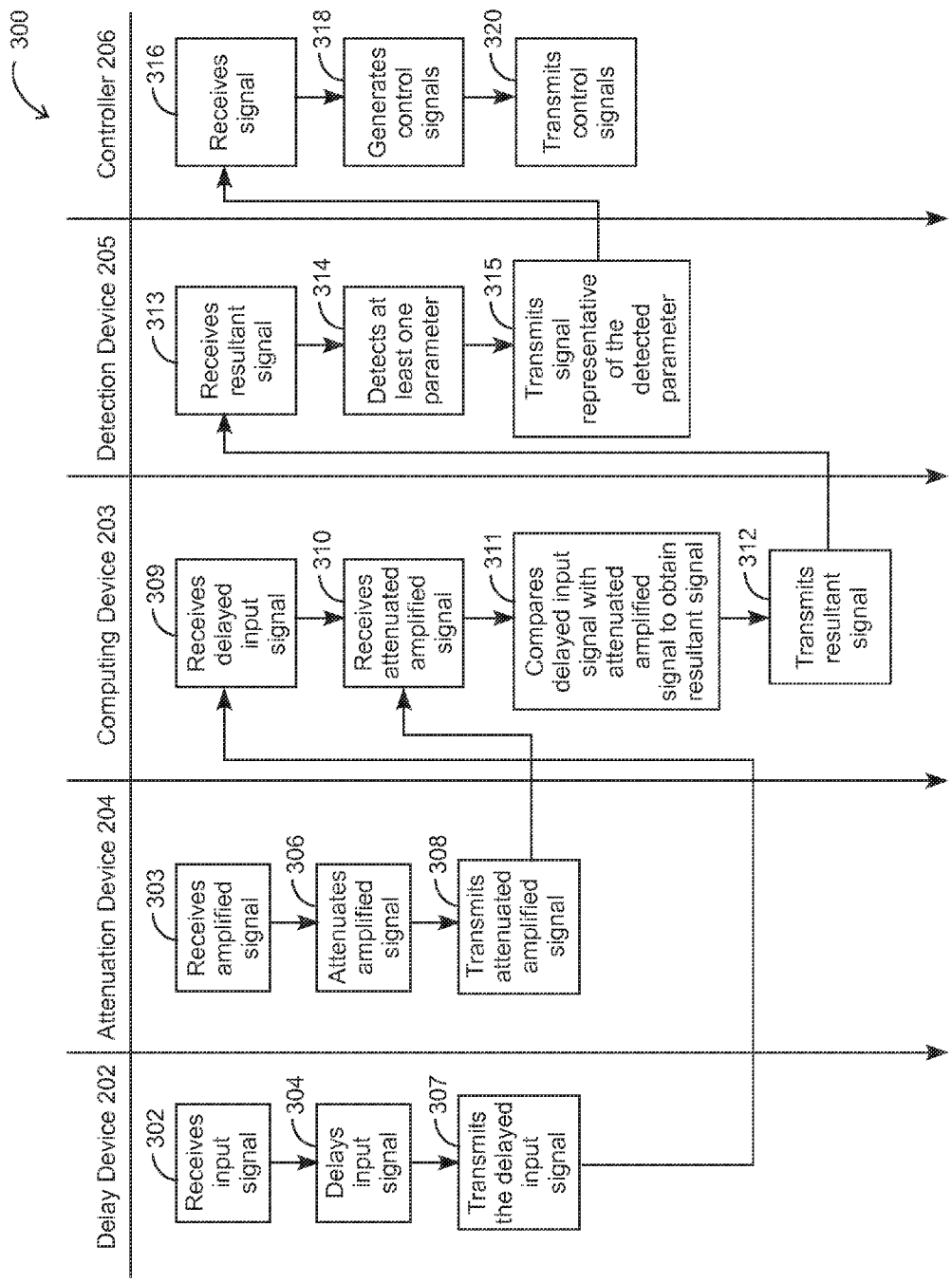
FIG. 3 is a swimlane diagram of an exemplary method of modifying distortion component(s) using the system linearization assembly shown in FIG. 2.

FIG. 3 is a swimlane diagram 300 of an exemplary method of modifying distortion component(s) using system linearization assembly 110 (shown in FIGS. 1 and 2). At least a portion of an input signal from a signal source (not shown) is transmitted to input bias tee 102 (shown in FIG. 1) such that the signal can be amplified by amplifier 104 (shown in FIG. 1) and a portion of the input signal is transmitted to and received by delay device 202 (shown in FIG. 2) in step 302. In step 303, the portion of the input signal that has been amplified (i.e., amplified signal) is transmitted from amplifier 104 to and received by attenuation device 204 (shown in FIG. 2). As described above, the amplified signal includes a time varying parameter, such as a plurality of waves, representing a plurality of frequency components including at least one component caused by non-linear intermodulation distortion (e.g., IMD). As described above, amplifier 104 exhibits some level of non-linear behavior which distorts the amplified signal. That is, the amplified signal has non-linear component(s) (i.e., the non-linear intermodulation distortion component).

In step 304, delay device 202 delays the input signal by at least a predetermined delay function. For example, delay device 202 can delay the input signal by a time measurement, such as in milliseconds or microseconds, that is equal to the time delay of the signals or an average of the signals passing through amplifier 104 such that the phase of the delayed signal and the attenuated signal are equal. In step 306, attenuation device 204 attenuates the amplified signal by a factor that is equal to at least one parameter of amplifier 104. For example, attenuation device 204 can attenuate the amplified signal by a factor that is equal to the gain of the amplifier 104. When the input signal and the amplified signal are later compared, the performance of steps 304 and 306 ensures that the only difference between the input signal and the amplified signal are the non-linear components in the amplified signal.

In step 307, delay device 202 transmits the delayed input signal to computing device 203 (shown in FIG. 2) and, in step 308, attenuation device 204 transmits the attenuated amplified signal to computing device 203. Computing device 203 receives the delayed input signal and the attenuated amplified signal in steps 309 and 310, respectively. In step 311, computing device 203 compares the delayed input signal with the attenuated amplified signal to obtain a resultant signal. For example, computing device 203 subtracts the attenuated amplified signal from the delayed input signal such that the resultant signal is representative of the remaining non-linear component(s) that had been injected into the amplified signal by amplifier 104. In step 312, computing device 203 transmits the resultant signal to detection device 205 (shown in FIG. 2).

The resultant signal is received by detection device 205 in step 313. Detection device 205, in step 314, detects or measures at least one parameter of the resultant signal. For example, detection device 205 detects or measures the phase and/or amplitude of the resulting non-linear components. A signal representative the detected parameter is transmitted to controller 206 (shown in FIG. 2) in step 315.

The signal representative of the detected parameter is received by controller 206 in step 316. Based on the detected parameter, controller 206 modifies the output signal by adjusting the voltages or currents being provided to input bias tee 102 (shown in FIG. 1) and output bias tee 108. More specifically, based on the measured value, controller 206 generates control signals in step 318. These control signals are directed at controlling the controllable voltage or current regulators (not shown) within first power supply 112 (shown in FIG. 1) and second power supply 114 (shown in FIG. 1) such that voltages or currents (i.e., DC voltages or currents) being supplied by first power supply 112 to input bias tee 102 and by second power supply 114 to output bias tee 108 can be adjusted. In step 320, controller 206 transmits the control signals to first power supply 112 and to second power supply 114 via control interface 216 (shown in FIG. 2). For example, based on the detected parameter, controller 206 can generate control signals to decrease the voltage or current supplied by the power supply. As such, the control signals adjust the voltage or current regulators in first power supply 112 and second power supply 114 such that the power being transmitted to input bias tee 102 and to output bias tee 108, respectively, is substantially reduced. This reduction enables the non-linear intermodulation distortion component(s) to be decreased or minimized.

In some embodiments, controller's response parameters can be optimized and calibrated using a two tone test to maximize system performance. The controller may also be configured to adapt to varying input power levels, for instance by adapting to changes in the signal received by detection device 205. Moreover, detection device 205 can be phase sensitive to gain more information about the non-linear distortion and to provide more information to controller 206. For example, if detection device 205 is phase sensitive, and this phase information is passed or transmitted to controller 206, controller 206 can gain an additional way of knowing which direction to adjust the bias voltages to minimize the non-linear component(s).

As compared to known systems, such as amplifier linearization systems, that merely "cover" or "patch" non-linear intermodulation distortion components within signals to compensate for the effects of the non-linear components, the embodiments described herein provide a system linearization assembly that can be used with such systems to facilitate a reduction or minimization of the non-linear intermodulation distortion components from the system itself. The system linearization assembly is configured to receive an input signal from a signal source and to delay the input signal by a predetermined delay function. The system linearization assembly is also configured to receive a modified output signal from a signal modifying device, wherein the modified output signal is based on the input signal and includes a time varying parameter representing a plurality of frequency components including at least one component caused by non-linear intermodulation distortion. The modified output signal can be attenuated by a factor that is equal to at least one parameter of the signal modifying device and the attenuated modified output signal can be compared with the delayed input signal to obtain a resultant signal that includes the component caused by non-linear intermodulation distortion. At least one parameter of the resultant signal can be detected and the detected parameter can be used to facilitate a modification of the component caused by non-linear intermodulation distortion. Such a modification enables a reduction or minimization of the component caused by non-linear intermodulation distortion from the signal processing system by modifying the signal processing system itself rather than merely "covering" or "patching" the non-linear intermodulation distortion component to hide its effects.

Exemplary embodiments of the assemblies, systems, and methods are described above in detail. The assemblies, systems, and methods are not limited to the specific embodiments described herein, but rather, components of the assemblies, systems, and/or steps of the method may be utilized independently and separately from other components and/or steps described herein. For example, the assembly may also be used in combination with other systems and methods, and is not limited to practice with only a system as described herein. Rather, the exemplary embodiment can be implemented and utilized in connection with many other systems.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system linearization assembly comprising:
   a delay device configured to receive an input signal from a signal source and to delay the input signal by a predetermined delay function;
   an attenuation device coupled to said delay device, wherein said attenuation device is configured to:
     receive a modified output signal from a signal modifying device, wherein the modified output signal is based on the input signal and includes a time varying parameter representing a plurality of frequency components including at least one component caused by non-linear intermodulation distortion; and
     attenuate the modified output signal by a factor that is equal to at least one parameter of the signal modifying device, wherein said delay device is configured to delay the input signal and said attenuation device is configured to attenuate the modified output signal such that the difference between the delayed input signal and the modified output signal is equal to the at least one component caused by non-linear intermodulation distortion; and
   a computing device coupled to said delay device and to said attenuation device, wherein said computing device is configured to compare the attenuated modified output signal with the delayed input signal to obtain a resultant signal that includes the at least one component caused by non-linear intermodulation distortion;
   a detection device coupled to said computing device, wherein said detection device is configured to detect at least one parameter of the resultant signal; and
   a controller coupled to said detection device, wherein said controller is configured to facilitate a modification of the at least one component caused by non-linear intermodulation distortion based on the detected at least one parameter by being configured to modify at least one of a voltage value or a current value being supplied by at least one of a first power supply or a second power supply.

2. A system linearization assembly in accordance with claim 1, wherein said delay device is configured to delay the input signal by the predetermined delay function that is equal to the delay of a plurality of signals that are transmitted through the signal modifying device.

3. A system linearization assembly in accordance with claim 1, wherein said attenuation device is configured to attenuate the modified output signal by the factor that is equal to the gain of the signal modifying device.

4. A system linearization assembly in accordance with claim 1, wherein said detection device is configured to detect a phase of the resultant signal.

5. A signal linearization assembly in accordance with claim 1, wherein said detection device is configured to detect an amplitude of the resultant signal.

6. A system linearization assembly in accordance with claim 1, wherein said controller is configured to modify at least one of the voltage value or the current value by generating a control signal to decrease at least one of the voltage value or the current value based on the detected at least one parameter.

7. A system linearization assembly in accordance with claim 1, wherein said controller is configured to modify at least one of the voltage value or the current value by being configured to control at least one of a voltage regulator or a current regulator within at least one of the first power supply or the second power supply.

8. A signal processing system comprising:
   a signal modifying device that is configured to receive an input signal from a signal source and to modify the input signal to generate a modified output signal, wherein the modified output signal includes a time varying parameter representing a plurality of frequency components including at least one component caused by non-linear intermodulation distortion; and
   a system linearization assembly coupled to said signal modifying device, wherein said system linearization assembly comprises:
     a delay device configured to receive the input signal and to delay the input signal by a predetermined delay function;
     an attenuation device coupled to said delay device, wherein said attenuation device is configured to:
       receive the modified output signal from said signal modifying device;
       attenuate the modified output signal by a factor that is equal to at least one parameter of said signal modifying device, wherein said delay device is configured to delay the input signal and said attenuation device is configured to attenuate the modified output signal such that the difference between the delayed input signal and the modified output signal is equal to the at least one component caused by non-linear intermodulation distortion; and
     a computing device coupled to said delay device and to said attenuation device, wherein said computing device is configured to compare the attenuated modified output signal with the delayed input signal to obtain a resultant signal that includes the at least one component caused by non-linear intermodulation distortion; and
     a detection device coupled to said computing device, wherein said detection device is configured to detect at least one parameter of the resultant signal; and
     a controller coupled to said detection device, wherein said controller is configured to facilitate a modification of the at least one component caused by non-linear intermodulation distortion based on the detected at least one parameter by being configured to modify at least one of a voltage value or a current value being supplied by at least one of a first power supply or a second power supply.

9. A signal processing system in accordance with claim 8, wherein said delay device is configured to delay the input signal by the predetermined delay function that is equal to the delay of a plurality of signals that are transmitted through said signal modifying device.

10. A signal processing system in accordance with claim 8, wherein said attenuation device is configured to attenuate the modified output signal by the factor that is equal to the gain of said signal modifying device.

11. A signal processing system in accordance with claim 8, wherein said detection device is configured to detect a phase of the resultant signal.

12. A signal processing system in accordance with claim 8, wherein said detection device is configured to detect an amplitude of the resultant signal.

13. A signal processing system in accordance with claim 8, wherein said controller is configured to modify at least one of the voltage value or the current value by generating a control signal to decrease at least one of the voltage value or the current value based on the detected at least one parameter.

14. A signal processing system in accordance with claim 8, wherein said controller is configured to modify at least one of the voltage value or the current value by being configured to control at least one of a voltage regulator or a current regulator within at least one of the first power supply or the second power supply.

15. A method for modifying distortion components, said method comprising:

receiving an input signal via a delay device;

delaying the input signal by a delay function via the delay device;

transmitting a modified output signal from a signal modifying device to an attenuation device that is coupled to the delay device, wherein the modified output signal is based on the input signal and includes a time varying parameter representing a plurality of frequency components including at least one component caused by non-linear intermodulation distortion;

attenuating the modified output signal by a factor that is equal to at least one parameter of the signal modifying device, via the attenuation device, wherein the input signal is delayed and the modified output signal is attenuated such that the difference between the delayed input signal and the modified output signal is equal to the at least one component caused by non-linear intermodulation distortion;

comparing the attenuated modified output signal with the delayed input signal to obtain a resultant signal that is representative of the at least one component caused by non-linear intermodulation distortion, via a computing device that is coupled to the delay device and the attenuation device;

detecting at least one parameter of the resultant signal via a detection device that is coupled to the computing device; and facilitating a modification of the at least one component caused by non-linear intermodulation distortion based on the detected at least one parameter, via a controller that is coupled to the detection device, by modifying at least one of a voltage value or a current value being supplied by at least one of a first power supply or a second power supply.

16. A method in accordance with claim 15, wherein delaying the input signal comprises delaying the input signal by the predetermined delay function is equal to the delay of a plurality of signals that are transmitted through the signal modifying device.

17. A method in accordance with claim 15, wherein attenuating the modified output signal comprises attenuating the modified output signal by the factor that is equal to the gain of the signal modifying device.

18. A method in accordance with claim 15, wherein detecting at least one parameter of the resultant signal comprises detecting a phase of the resultant signal.

19. A method in accordance with claim 15, wherein detecting at least one parameter of the resultant signal comprises detecting an amplitude of the resultant signal.

20. A method in accordance with claim 15, wherein facilitating a modification of the at least one component caused by non-linear intermodulation distortion comprises generating a control signal to decrease at least one of the voltage value or the current value based on the detected at least one parameter.

* * * * *